United States Patent
Narushima et al.

(10) Patent No.: US 8,257,790 B2
(45) Date of Patent: Sep. 4, 2012

(54) TI-CONTAINING FILM FORMATION METHOD AND STORAGE MEDIUM

(75) Inventors: Kensaku Narushima, Nirasaki (JP);
Satoshi Wakabayashi, Nirasaki (JP);
Kunihiro Tada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 800 days.

(21) Appl. No.: 12/280,044

(22) PCT Filed: Feb. 21, 2007

(86) PCT No.: PCT/JP2007/053152
§ 371 (c)(1),
(2), (4) Date: Aug. 20, 2008

(87) PCT Pub. No.: WO2007/105432
PCT Pub. Date: Sep. 20, 2007

(65) Prior Publication Data
US 2010/0227062 A1    Sep. 9, 2010

(30) Foreign Application Priority Data
Feb. 24, 2006 (JP) .................. 2006-048311

(51) Int. Cl.
*C23C 16/00* (2006.01)
*C23C 16/06* (2006.01)
*C23C 16/08* (2006.01)

(52) U.S. Cl. ......... 427/255.391; 427/248.1; 427/255.39; 427/255.28; 427/255.23

(58) Field of Classification Search ............... 427/248.1, 427/255.391, 255.39, 255.28, 255.23
See application file for complete search history.

(56) References Cited

U.S. PATENT DOCUMENTS

| 5,989,652 A * | 11/1999 | Ameen et al. .................. 427/534 |
| 6,242,347 B1 | 6/2001 | Vasudev et al. |
| 6,635,569 B1 * | 10/2003 | Ameen et al. .................. 438/680 |
| 2001/0021414 A1 | 9/2001 | Morishima et al. |
| 2002/0029748 A1 | 3/2002 | Kuwada et al. |
| 2005/0136657 A1 * | 6/2005 | Yokoi et al. .................... 438/680 |
| 2005/0221005 A1 * | 10/2005 | Wakabayashi et al. .... 427/248.1 |

FOREIGN PATENT DOCUMENTS

| CN | 1319146 A | 10/2001 |
| JP | 2001144033 A * | 5/2001 |
| JP | 2001 247968 | 9/2001 |
| JP | 2002 155364 | 5/2002 |
| JP | 2002 526648 | 8/2002 |
| JP | 2003 313666 | 11/2003 |
| JP | 2005 194540 | 7/2005 |
| JP | 2005 248231 | 9/2005 |

* cited by examiner

*Primary Examiner* — Kelly M Gambetta
(74) *Attorney, Agent, or Firm* — Oblon, Spivak, McClelland, Maier & Neustadt, L.L.P.

(57) ABSTRACT

A Ti film is formed on a surface of a wafer W placed inside a chamber 31, while injecting a process gas containing $TiCl_4$ gas into the chamber 31 from a showerhead 40 made of an Ni-containing material at least at a surface. The method includes performing formation of a Ti film on a predetermined number of wafers W while setting the showerhead 40 at a temperature of 300° C. or more and less than 450° C., and setting $TiCl_4$ gas at a flow rate of 1 to 12 mL/min (sccm) or setting $TiCl_4$ gas at a partial pressure of 0.1 to 2.5 Pa, and then, performing cleaning inside the chamber 31, while setting the showerhead 40 at a temperature of 200 to 300° C., and supplying $ClF_3$ gas into the chamber 31.

20 Claims, 5 Drawing Sheets

US 8,257,790 B2

TI-CONTAINING FILM FORMATION METHOD AND STORAGE MEDIUM

TECHNICAL FIELD

The present invention relates to a Ti-containing film formation method for forming a Ti-containing film on the surface of a target substrate placed inside a chamber, while injecting a process gas containing $TiCl_4$ gas into the chamber from a showerhead. The present invention further relates to a computer readable storage medium.

BACKGROUND ART

In the process sequence of manufacturing semiconductor devices, various gas processes, such as a film formation process and an etching process, are repeatedly performed on a target object, such as a semiconductor wafer (which will be simply referred to as "wafer"). A gas process of this kind comprises steps of placing a wafer inside a chamber, and supplying a process gas containing a reactive gas (corrosive gas), such as a halogen, e.g., Cl or F, into the chamber, while vacuum-exhausting the chamber. For example, in a CVD process for forming a Ti-containing film, such as a Ti or TiN film, a wafer is heated to, e.g., about 700° C., and $TiCl_4$ gas serving as a process gas (film formation gas) and a reducing gas are supplied into a chamber set at a predetermined vacuum pressure, so that the film formation process is performed, wherein the process gas is turned into plasma, as needed.

On the other hand, the material of a showerhead disposed inside a chamber is conventionally an Al alloy (such as JIS A 5052) or stainless steel. In a gas process using a halogen-containing gas, such as $TiCl_4$ gas, a component of the showerhead, such as Al, Fe, or Cu, reacts with a hydrogen halide, such as HCl or HF, which is a by-product of the gas process, and a metal halide of this component is thereby generated. The metal halide has a high vapor pressure inside the chamber set at a vacuum pressure and thus can be easily vaporized. Consequently, the metal halide is diffused inside the chamber and generates particles inside the chamber and/or it is taken into a deposited substance during film formation and causes metal contamination on the wafer.

The metal contamination is mixed into Si diffusion layers formed at the bottom of contact holes on the wafer and is easily diffused in Si. Consequently, some of the characteristics of transistors, such as the breakdown voltage and/or ohmic properties, may be deteriorated.

In recent years, patterns formed on wafers have been increasing miniaturized and brought about smaller contact holes with a diameter of about 0.13 μm and smaller Si diffusion layers with a thickness of about 80 nm. Use of Si diffusion layers having a junction at a smaller depth (a shallower junction) makes it prominent for transistors to suffer deterioration in characteristics due to the metal contamination described above. Consequently, there are increasing demands for suppression of such metal contamination. Particularly, where a metal film is formed by CVD, suppression of such metal contamination is very important.

As a technique for solving this problem, Jpn. Pat. Appln. KOKAI Publication No. 2003-313666 discloses a technique for forming an Ni coating film or the like on the surface of members, such as a showerhead, inside a chamber. When Ni comes into contact with a halogen-containing gas, it generates a halide. Since Ni halide has a low vapor pressure and thus cannot be easily vaporized, particle generation inside the chamber is decreased, and metal contamination on wafers is thereby suppressed.

However, where the surface of the showerhead is covered with Ni, a black reaction product may be formed on the showerhead surface due to some reaction and easily peeled off to generate particles after a Ti film or the like is formed. Further, separable parts of the showerhead may be strongly fixed to each other by diffusion bonding of this reaction product. Once compounds of this kind are formed, they can be hardly removed under conditions conventionally used for dry cleaning.

DISCLOSURE OF INVENTION

An object of the present invention is to provide a Ti-containing film formation method for forming a Ti-containing film while supplying $TiCl_4$ as a process gas into a chamber provided with a showerhead, at least the surface of which is made of a Ni-containing material, wherein the method can prevent a reaction product from being formed on the showerhead, and can effectively remove an existing reaction product formed previously.

In order to achieve the object described above, the present inventors examined the black reaction product formed on the surface of a showerheads serving as a gas injection member. As a result, it was confirmed that this reaction product was a substance containing Ni and Ti. From this result, a finding has been derived such that the black compound is a reaction product of Ni of the showerhead with $TiCl_4$ used as a process gas and/or $TiCl_x$ and Ti generated by reduction of $TiCl_4$. Based on this finding, the present inventors have adopted an arrangement to decrease the temperature of the gas injection member in film formation and to decrease the supply flow rate of $TiCl_4$ gas, so as to retard the reaction described above. Further, the present inventors have adopted an arrangement to increase the temperature used in cleaning, so as to sufficiently remove the compound described above, even if the compound has been generated.

Specifically, according to a first aspect of the present invention, there is provided a Ti-containing film formation method for forming a Ti-containing film on a surface of a target object placed inside a chamber, while injecting a process gas containing $TiCl_4$ gas into the chamber from a gas injection member comprising an Ni-containing material at least at a surface, the method comprising: performing formation of a Ti-containing film on a predetermined number of target objects, while setting the gas injection member at a temperature of 300° C. or more and less than 450° C., and setting $TiCl_4$ gas at a flow rate of 1 to 12 mL/min (sccm) or setting $TiCl_4$ gas at a partial pressure of 0.1 to 2.5 Pa; and then, performing cleaning inside the chamber with no target object present therein, while setting the gas injection member at a temperature of 200 to 300° C., and supplying a fluorine-containing cleaning gas into the chamber.

According to a second aspect of the present invention, there is provided a Ti-containing film formation method for forming a Ti-containing film on a surface of a target object placed inside a chamber, while injecting a process gas containing $TiCl_4$ gas into the chamber from a gas injection member comprising an Ni-containing material at least at a surface, the method comprising: forming a passivation film at least on the surface of the gas injection member, at which an Ni-containing material is exposed, while supplying a passivation gas into the chamber with no target object present therein; performing formation of a Ti-containing film on a predetermined number of target objects, while setting the gas injection member at a temperature of 300° C. or more and less than 450° C., and setting TiCl$_4$ gas at a flow rate of 1 to 12 mL/min (sccm) or setting TiCl$_4$ gas at a partial pressure of 0.1 to 2.5 Pa; and then, performing cleaning inside the chamber with no target object present therein, while setting the gas injection member at a temperature of 200 to 300° C., and supplying a fluorine-containing cleaning gas into the chamber.

In the second aspect, the passivation gas may be the same as the cleaning gas.

In the first or second aspect, prior to the formation of a Ti-containing film, the method preferably further comprises forming a pre-coating film at least on the surface of the gas injection member, while injecting a process gas containing TiCl$_4$ gas from the gas injection member into the chamber with no target object present therein.

In a typical embodiment, the method may comprise repeating, a plurality of times, the formation of a Ti-containing film on a predetermined number of target objects and the cleaning inside the chamber.

The Ti-containing film may be a Ti film. In this case, hydrogen gas may be used as a reducing gas. A nitriding process may be performed after a Ti film is formed.

The cleaning gas may be ClF$_3$ gas. The gas injection member may be typically a showerhead disposed to face the target object and having a number of gas injection holes formed therein.

According to a third aspect of the present invention, there is provided a storage medium that stores a program for execution on a computer to control a film formation apparatus, wherein the program, when executed, controls the film formation apparatus to conduct a Ti-containing film formation method for forming a Ti-containing film on a surface of a target object placed inside a chamber, while injecting a process gas containing TiCl$_4$ gas into the chamber from a gas injection member comprising an Ni-containing material at least at a surface, the method comprising: performing formation of a Ti-containing film on a predetermined number of target objects, while setting the gas injection member at a temperature of 300° C. or more and less than 450° C., and setting TiCl$_4$ gas at a flow rate of 1 to 12 mL/min (sccm) or setting TiCl$_4$ gas at a partial pressure of 0.1 to 2.5 Pa; and then, performing cleaning inside the chamber with no target object present therein, while setting the gas injection member at a temperature of 200 to 300° C., and supplying a fluorine-containing cleaning gas into the chamber.

According to a fourth aspect of the present invention, there is provided a storage medium that stores a program for execution on a computer to control a film formation apparatus, wherein the program, when executed, controls the film formation apparatus to conduct a Ti-containing film formation method for forming a Ti-containing film on a surface of a target object placed inside a chamber, while injecting a process gas containing TiCl$_4$ gas into the chamber from a gas injection member comprising an Ni-containing material at least at a surface, the method comprising: forming a passivation film at least on the surface of the gas injection member, at which an Ni-containing material is exposed, while supplying a passivation gas into the chamber with no target object present therein; performing formation of a Ti-containing film on a predetermined number of target objects, while setting the gas injection member at a temperature of 300° C. or more and less than 450° C., and setting TiCl$_4$ gas at a flow rate of 1 to 12 mL/min (sccm) or setting TiCl$_4$ gas at a partial pressure of 0.1 to 2.5 Pa; and then, performing cleaning inside the chamber with no target object present therein, while setting the gas injection member at a temperature of 200 to 300° C., and supplying a fluorine-containing cleaning gas into the chamber.

In the present invention, gas flow rates are expressed in mL/min, but they are converted values in accordance with a standard state, because the volume of gas changes significantly depending on temperature and pressure. Accordingly, flow rates are additionally provided with sccm, because flow rates converted in accordance with the standard state are expressed in sccm (Standard Cubic Centimeter per Minutes), in general. This standard state is a state (STP) with a temperature of 0° C. (273.15K) and a pressure of 1 atm (101,325 Pa).

According to the present invention, formation of a Ti-containing film is performed on a predetermined number of target objects, while setting the gas injection member at a low temperature of 300° C. or more and less than 450° C., and setting TiCl$_4$ gas at a low flow rate of 1 to 12 mL/min (sccm) or setting TiCl$_4$ gas at a low partial pressure of 2.5 Pa or less, so as to retard the reaction of Ni of the gas injection member with Ti. Further, subsequent cleaning inside the chamber is performed by use of a fluorine-containing cleaning gas, while setting the gas injection member at a temperature of 200 to 300° C. higher than the conventional temperature, so that NiTi compounds are removed by the cleaning even if they have been generated. Consequently it is possible to very effectively solve a problem concerning particles due to formation of an NiTi layer and a problem concerning diffusion bonding between structural components. Further, where a passivation film is formed, it is possible to effectively retard formation of an NiTi layer even where the showerhead is a new showerhead or a showerhead processed by chemical regeneration cleaning.

BEST MODE FOR CARRYING OUT THE INVENTION

An embodiment of the present invention will now be described with reference to the accompanying drawings.

Figure 1:
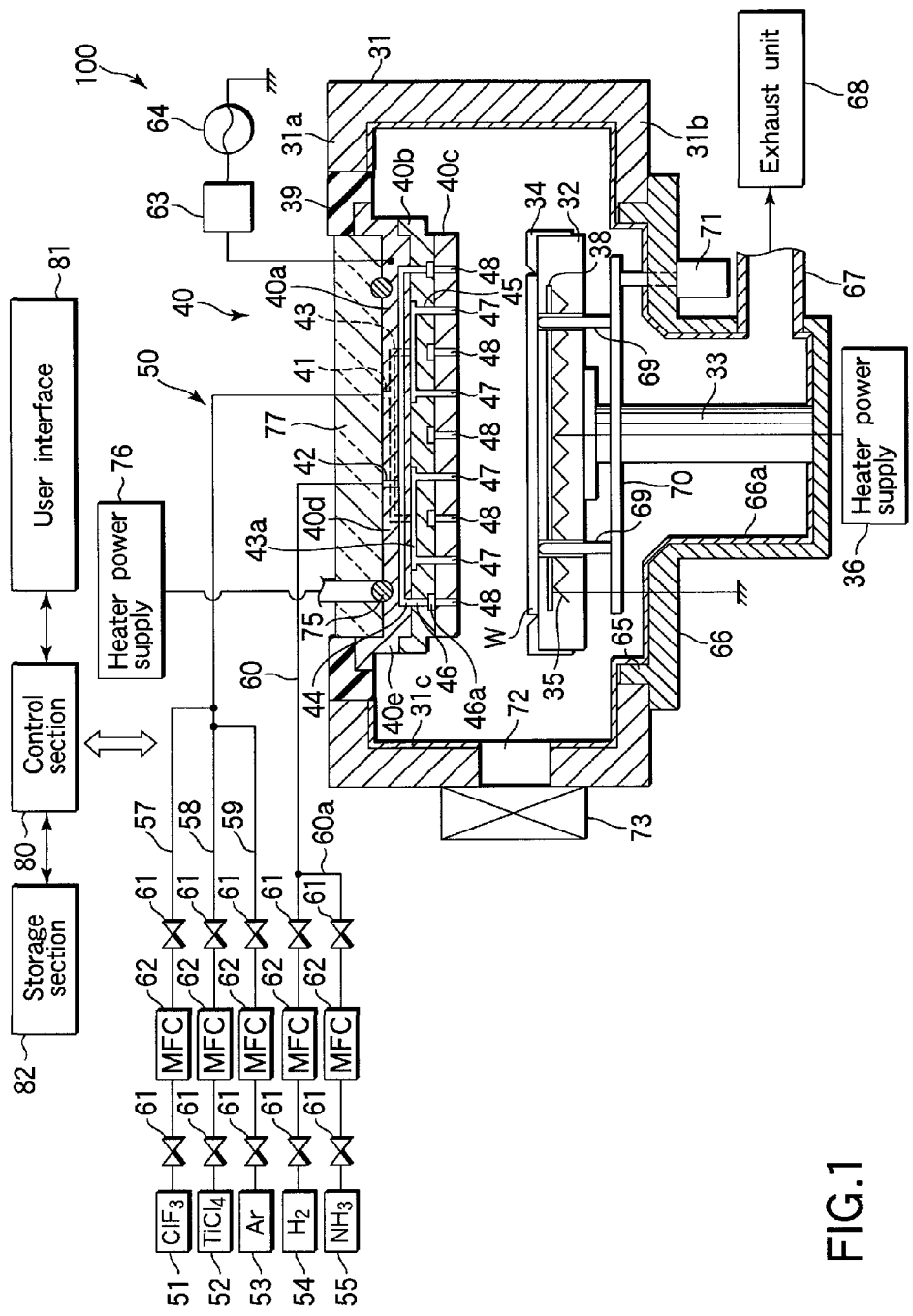
FIG. 1 This is a sectional view schematically showing an example of a Ti film formation apparatus used for performing a Ti-containing film formation method according to an embodiment of the present invention.

FIG. 1 is a sectional view schematically showing an example of a Ti film formation apparatus used for performing a Ti-containing film formation method according to an embodiment of the present invention. The Ti film formation apparatus 100 includes an essentially cylindrical chamber 31. The chamber 31 is formed of a base material made of aluminum or aluminum alloy (such as JIS A 5052) with an Ni-containing internal liner layer 31c formed on the internal surface of the base material. The Ni-containing internal liner layer 31c is typically made of pure Ni or an Ni alloy. Ni of the internal liner layer 31c reacts with a halogen-containing process gas and thereby generates a metal compound with a low vapor pressure. The internal liner layer 31c is fabricated by, e.g., ion plating, plating, or spray coating.

The chamber 31 is provided with a susceptor 32 disposed therein for supporting a target object or wafer W in a horizontal state. The susceptor 32 is supported by a cylindrical support member 33 disposed therebelow at the center. The susceptor 32 is provided with a guide ring 34 disposed on the edge to guide the wafer W. Further, the susceptor 32 is provided with a heater 35 built therein. The heater 35 is supplied with a power from a heater power supply 36 to heat the target substrate or wafer W to a predetermined temperature. Further, the susceptor 32 is provided with an electrode 38 embedded therein near the surface and grounded. The susceptor 32 may be made of a ceramic, such as AlN, so that a ceramic heater is formed.

A showerhead 40 serving as a gas injection member is disposed on the ceiling wall 31a of the chamber 31 through an insulating member 39. The showerhead 40 is formed of an upper block body 40a, a middle block body 40b, and a lower block body 40c, to essentially form a disk-like shape as a whole. The upper block body 40a includes a horizontal portion 40d that cooperates with the middle block body 40b and lower block body 40c to define a showerhead main body. The upper block body 40a further includes an annular support portion 40e extending outward and upward from the horizontal portion 40d, so that the upper block body 40a forms a recessed shape as a whole. The entirety of the showerhead 40 is supported through the annular support portion 40e. The showerhead 40 is made of an Ni-containing material, and is typically made of pure Ni or an Ni alloy. Injection holes 47 and 48 for injecting gases are alternately formed in the lower block body 40c. On the other hand, a first gas feed port 41 and a second gas feed port 42 are formed in the upper surface of the upper block body 40a. The first gas feed port 41 is divided into a number of gas passages 43 in the upper block body 40a. The middle block body 40b has gas passages 45 formed therein, which communicate with the gas passages 43 through communication passages 43a extending horizontally. The gas passages 45 communicate with the injection holes 47 formed in the lower block body 40c. The second gas feed port 42 is divided into a number of gas passages 44 in the upper block body 40a. The middle block body 40b has gas passages 46 formed therein, which communicate with the gas passages 44. The gas passages 46 are connected to communication passages 46a extending horizontally in the middle block body 40b. The communication passages 46a communicate with a number of injection holes 48 formed in the lower block body 40c. The first and second gas feed ports 41 and 42 are respectively connected to gas lines of a gas supply mechanism 50 described later.

The gas supply mechanism 50 includes a ClF$_3$ gas supply source 51 for supplying ClF$_3$ gas used as a cleaning gas, a TiCl$_4$ gas supply source 52 for supplying TiCl$_4$ gas used as a Ti compound gas, an Ar gas supply source 53 for supplying Ar gas, an H$_2$ gas supply source 54 for supplying H$_2$ gas used as a reducing gas, and an NH$_3$ gas supply source 55 for supplying NH$_3$ gas used as a nitriding gas. The ClF$_3$ gas supply source 51 is connected to a ClF$_3$ gas supply line 57, the TiCl$_4$ gas supply source 52 is connected to a TiCl$_4$ gas supply line 58, the Ar gas supply source 53 is connected to an Ar gas supply line 59, the H$_2$ gas supply source 54 is connected to an H$_2$ gas supply line 60, and the NH$_3$ gas supply source 55 is connected to an NH$_3$ gas supply line 60a. Further, the gas supply mechanism 50 includes an N$_2$ gas supply source (not shown). Each of the gas supply lines is provided with a mass-flow controller 62 and two valves 61 one on either side of the controller 62.

The first gas feed port 41 is connected to the TiCl$_4$ gas supply line 58 extending from the TiCl$_4$ gas supply source 52. The TiCl$_4$ gas supply line 58 is connected to the ClF$_3$ gas supply line 57 extending from the ClF$_3$ gas supply source 51, and is also connected to the Ar gas supply line 59 extending from the Ar gas supply source 53. The second gas feed port 42 is connected to the H$_2$ gas supply line 60 extending from the H$_2$ gas supply source 54. The H$_2$ gas supply line 60 is connected to the NH$_3$ gas supply line 60a extending from the NH$_3$ gas supply source 55. According to this arrangement, when a process is performed, TiCl$_4$ gas from the TiCl$_4$ gas supply source 52 and Ar gas from the Ar gas supply source 53 are supplied into the TiCl$_4$ gas supply line 58. This mixture gas flows through the first gas feed port 41 into the showerhead 40, and is then guided through the gas passages 43 and 45 and injected into the chamber 31 through the injection holes 47. On the other hand, H$_2$ gas from the H$_2$ gas supply source 54 is supplied into the H$_2$ gas supply line 60. This H$_2$ gas flows through the second gas feed port 42 into the showerhead 40, and is then guided through the gas passages 44 and 46 and injected into the chamber 31 through the injection holes 48. In other words, the showerhead 40 is of a post-mix type in which TiCl$_4$ gas and H$_2$ gas are supplied into the chamber 31 completely separately from each other, so that TiCl$_4$ gas and H$_2$ gas react with each other after they are injected and mixed. Alternatively, the showerhead 40 may be of a pre-mix type in which TiCl$_4$ gas and H$_2$ gas are mixed and then supplied into the chamber 31.

The showerhead 40 is connected to an RF (radio frequency) power supply 64 through a matching device 63, so that an RF power is applied from the RF power supply 64 to the showerhead 40, as needed. When an RF power is applied from the RF power supply 64, a gas supplied from the showerhead 40 into the chamber 31 is turned into plasma to perform a film formation process.

The showerhead 40 is provided with a heater 75 built in the horizontal portion 40d of the upper block body 40a to heat the showerhead 40. The heater 75 is connected to the heater power supply 76 and is supplied with a power from the heater power supply 76, so that the showerhead 40 is heated to a predetermined temperature. A heat insulating member 77 is disposed on the recessed portion of the upper block body 40a to improve the heating efficiency.

The bottom wall 31b of the chamber 31 has a circular opening 65 at the center, and an exhaust chamber 66 is disposed on the bottom wall 31b to project downward and cover the opening 65. The internal wall of the exhaust chamber 66 is covered with a coating layer 66a made of the same material as that of the internal liner layer 31c. One side of the exhaust chamber 66 is connected to an exhaust line 67 that is connected to an exhaust unit 68. The exhaust unit 68 can be operated to vacuum-exhaust the interior of the chamber 31 to a predetermined vacuum level.

The susceptor 32 is provided with three wafer support pins 69 (only two of them are shown in FIG. 1) that can project and retreat relative to the surface of the susceptor 32 to support the wafer W and move it up and down. The wafer support pins 69 are fixed to a support plate 70 and are moved up and down along with the support plate 70 by a drive mechanism 71, such as an air cylinder.

The chamber 31 has a transfer port 72 formed in the sidewall and provided with a gate valve 73 for opening/closing the transfer port 72, so that the wafer W is transferred between the chamber 31 and a wafer transfer chamber (not shown) adjacent thereto, through the transfer port 72.

The respective components of the Ti film formation apparatus 100 are connected to and controlled by a control section 80 comprising a microprocessor (computer). The control section 80 is connected to a user interface 81 including, e.g. a keyboard and a display, wherein the keyboard is used for an operator to input commands for operating the Ti film formation apparatus 100, and the display is used for showing visualized images of the operational status of the Ti film formation apparatus 100. Further, the control section 80 is connected to a storage section 82 that stores recipes, i.e., control programs for the control section 80 to control the Ti film formation apparatus 100 so as to perform various processes, and programs for respective components of the Ti film formation apparatus 100 to perform processes in accordance with process conditions. Recipes may be stored in a hard disk or semiconductor memory, or stored in a portable storage medium, such as a CDROM or DVD, to be attached to a predetermined position in the storage section 82. Further, recipes may be transmitted from another apparatus through, e.g., a dedicated line, as needed. A required recipe is retrieved from the storage section 82 and executed by the control section 80 in accordance with an instruction or the like input through the user interface 81. Consequently, the Ti film formation apparatus 100 can perform a predetermined process under the control of the control section 80.

Next, an explanation will be given of a Ti film formation method according to an embodiment performed in the Ti film formation apparatus 100 described above.

Figure 2:
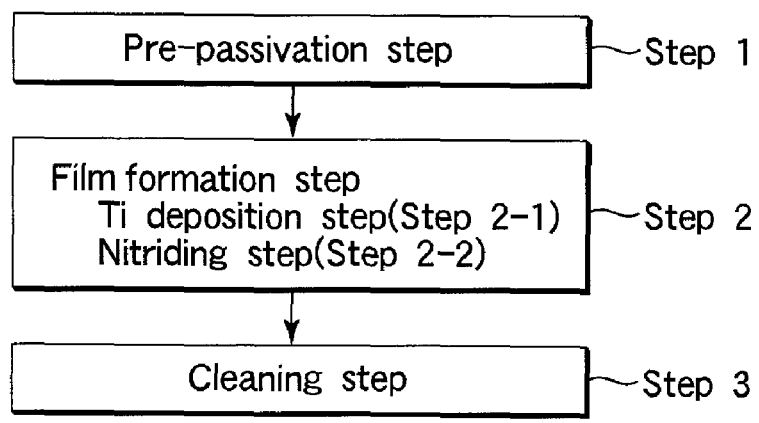
FIG. 2 This is a flow chart showing a Ti-containing film formation method according to an embodiment of the present invention.

In this embodiment, where the showerhead is a new showerhead or a showerhead processed by chemical regeneration cleaning, a pre-passivation step (Step 1), a film formation step (Step 2), and a cleaning step (Step 3) are performed, as shown in FIG. 2.

At first, the pre-passivation step of Step 1 will be explained.

Where the showerhead 40 is a new showerhead or a showerhead processed by chemical regeneration cleaning using hydrogenated $NH_3$, Ni or an Ni alloy is exposed on the surface. If pre-coating is performed thereon as it is, $TiCl_4$ gas reacts with Ni and easily generates a black NiTi layer between the Ti pre-coating layer and showerhead, in accordance with the following reaction where the showerhead is made of pure Ni, for example.

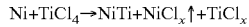

Where such an NiTi layer is formed, the pre-coating layer can be easily peeled off and generate particles. In light of this, where the showerhead 40 is a new showerhead or a showerhead processed by chemical regeneration cleaning, $ClF_3$ gas is supplied from the $ClF_3$ gas supply source 51 into the chamber 31 prior to the film formation step, so that an $NiF_x$ passivation film serving as a protection film is formed on the surface of the showerhead 40 in-situ.

(where PF denotes a passivation film)

Where the $NiF_x$ passivation film is thus formed, subsequent supply of $TiCl_4$ gas does not bring about generation of a film that can be easily peeled off, such as NiTi, but brings about generation of gaseous $NiCl_x$ and a $TiF_x$ passivation film, thereby preventing film peeling.

This pre-passivation step is preferably performed under the following conditions.
$ClF_3$ gas flow rate: 100 to 2,000 mL/min (sccm),
Ar gas flow rate: 100 to 2,000 mL/min (sccm),
$N_2$ gas flow rate: 100 to 2,000 mL/min (sccm),
Pressure: 133.3 to 1,333 Pa,
Temperature: 150 to 500° C., and
Time: 500 to 3,600 sec.

In this case, gas flow rates are expressed in mL/min, but they are converted values (typically expressed in sccm) in accordance with a standard state, so they are additionally provided with sccm (this is also applied to the other cases). This standard state is STP described previously.

As described above, the pre-passivation step is preferably arranged to supply $ClF_3$ gas, which has been prepared as a cleaning gas, to form a passivation film, without using an additional gas supply mechanism. However, as long as an effective passivation film of a metal fluoride is formed, another fluorine-containing gas may be used. Examples of another fluorine-containing gas are $NF_3$, HF, $F_2$, $C_2F_6$, and $C_3F_8$.

This pre-passivation step is required only where the showerhead is a new showerhead or a showerhead processed by chemical regeneration cleaning, because a $ClF_3$ cleaning step performed in subsequent processes causes the same reaction as that described above, and brings about an $NiF_x$ passivation film. Where the showerhead is a new showerhead or a showerhead processed by chemical regeneration cleaning, the pre-passivation step for forming a passivation film is preferably performed to prevent NiTi compounds from being generated in the initial stage. However, the pre-passivation step is not indispensable.

After this pre-passivation step, Ti pre-coating is performed in preparation for a subsequent film formation step. In the pre-coating, the chamber 31 with no wafer W present therein is exhausted by the exhaust unit 68 at full throttle and $N_2$ gas is supplied into the chamber 31, while the interior of the chamber 31 is pre-heated by the heater 35. After the temperature is stabilized, Ar gas, $H_2$ gas, and $TiCl_4$ gas are supplied at predetermined flow rates through the showerhead 40 to form a pre-coating Ti film on the inner wall of the chamber 31, the inner wall of the exhaust chamber 66, and the showerhead 40 by use of heat from the heaters 35 and 75. This pre-coating is performed essentially under the same conditions as those for a Ti deposition step described later. When the pre-coating is performed, the $NiF_x$ passivation film present on the surface of the showerhead 40 retards NiTi formation.

The film formation step of Step 2 comprises a Ti deposition step (Step 2-1) and a nitriding step (Step 2-2).

In the Ti deposition step of Step 2-1, the interior of the chamber 31 processed by the pre-coating is adjusted to have the same atmosphere as that of an external portion connected to the chamber 31 through the gate valve 73. Then, the gate valve 73 is opened, and a wafer W is transferred from a wafer transfer chamber (not shown) set in a vacuum state through the transfer port 72 into the chamber 31. Then, Ar gas is supplied into the chamber 31 and the wafer W is pre-heated. When the wafer temperature is essentially stabilized, Ar gas, $H_2$ gas, and $TiCl_4$ gas are caused to flow at predetermined flow rates through a pre-flow line (not shown) to perform pre-flow. Then, while the gas flow rates and pressure are being maintained to be the same, the gases are switched from the pre-flow line to the film formation line, so that they are supplied through the showerhead 40 into the chamber 31. At this time, an RF power is applied from the RF power supply 64 to the showerhead 40, so that the Ar gas, H$_2$ gas, and TiCl$_4$ gas supplied into the chamber 31 are turned into plasma. Then, the gases activated by plasma react with each other on the wafer W heated by the heater 35 to a predetermined temperature, and Ti is thereby deposited on the wafer W. Consequently, a Ti film having a predetermined thickness is formed when a predetermined time has elapsed.

In this step, the temperature of the showerhead 40 is set by the heater 75 to be 300° C. or more and less than 450° C., and the flow rate of TiCl$_4$ gas is set to be 1 to 12 mL/min (sccm).

Conventionally, the temperature of the showerhead 40 is control to be 450° C. or more, mainly in light of the quality of the pre-coating film, and the flow rate of TiCl$_4$ gas is set to be as large as possible in light of throughput. However, it has been found that, where the temperature of the showerhead 40 is thus relatively high and the TiCl$_4$ flow rate is large, the reactivity between Ni and Ti on the surface of the showerhead 40 is so high that an NiTi layer can be easily formed on the surface of the showerhead 40. Where the NiTi layer is thus formed, it can be easily peeled off and generate particles, and/or the components of the showerhead 40 can be easily fixed by diffusion bonding and become unseparable.

On the other hand, where the temperature of the showerhead 40 is set to be less than 450° C. and the flow rate of TiCl$_4$ gas is set to be 12 mL/min (sccm) or less, the reaction between Ni and Ti is suppressed. The temperature of the showerhead 40 is set to be lower, so that, not only the reactivity is decreased, but also chlorine can remain in the Ti pre-coating film and retard the reaction of the Ti pre-coating film with Ni. Conventionally, the showerhead temperature is set to be relatively high, which is also conceived to decrease the chlorine content in the Ti pre-coating film. In reverse, where chlorine is allowed by a lower temperature to remain to some extent, the reactivity between Ni and Ti is decreased. Further, the flow rate of TiCl$_4$ gas is set to be as small as possible, so as to regard the reaction of generating NiTi compounds, because TiCl$_4$ gas directly contributes to this reaction. Since the reaction between Ni and Ti is thus suppressed, an NiTi layer can be hardly formed, and problems concerning particles and diffusion bonding are thereby remarkably decreased.

In order to decrease, as far as possible, TiCl$_4$ gas that directly contributes the reaction of generating NiTi compounds, the partial pressure of TiCl$_4$ gas may be used for setting, in place of the flow rate of TiCl$_4$ gas. In this case, the partial pressure of TiCl$_4$ gas is set to be 0.1 to 2.5 Pa. Where the upper limit of the partial pressure of TiCl$_4$ gas is set at 2.5 Pa, the reaction between Ni and Ti is suppressed.

The prescription of the flow rate of TiCl$_4$ gas described above is suitable for processes typically for 300-mm wafers, while the prescription of the partial pressure of TiCl$_4$ gas is applicable without reference to the wafer size and apparatus type.

The lower limit of the temperature of the showerhead 40 is set at 300° C. in light of the quality of the Ti pre-coating film. Further, the lower limit of the flow rate of TiCl$_4$ gas is set at 1 mL/min (sccm), and the lower limit of the partial pressure of TiCl$_4$ gas is set at 0.1 Pa. If these parameters are lower than the values descried above, the film formation rate goes out of the practical range, so a predetermined throughput can be hardly ensured.

The showerhead temperature is more preferably set to be 380 to 450° C., and the flow rate of TiCl$_4$ gas is more preferably set to be 3 to 12 mL/min (sccm). The partial pressure of TiCl$_4$ gas is more preferably set to be 0.4 to 2.0 Pa.

Other conditions of the Ti film deposition step are set to be within respective preferable ranges, as follows.

i) RF power from RF power supply 64,
Frequency: 300 kHz to 27 MHz, and
Power: 100 to 1,500 W,
ii) Temperature of susceptor 32 by heater 35: 300 to 650° C.,
iii) Ar gas flow rate: 500 to 2,000 mL/min (sccm),
iv) H$_2$ gas flow rate: 1,000 to 5,000 mL/min (sccm), and
v) Pressure in chamber: 133 to 1,333 Pa (1 to 10 Torr).

The time period of the Ti deposition step is suitably set in accordance with a film thickness to be obtained.

After this step, the nitriding step of Step 2-2 is performed. In this nitriding step, subsequently to the Ti deposition step, supply of TiCl$_4$ gas is stopped and H$_2$ gas and Ar gas are kept supplied. Further, while the interior of the chamber 31 (the chamber wall, showerhead surface, and so forth) is heated to an appropriate temperature, NH$_3$ gas used as a nitriding gas is supplied. Further, an RF power is applied from the RF power supply 64 to the showerhead 40, so that the process gases are turned into plasma. Consequently, the surface of the Ti thin film formed on the wafer W is nitrided by the process gases activated by plasma.

Conditions of the nitriding step are preferably set, as follows.

i) RF power from RF power supply 64,
Frequency: 300 kHz to 27 MHz, and
Power: 500 to 1,500 W,
ii) Temperature of susceptor 32 by heater 35: 300 to 650° C.,
iii) Ar gas flow rate: 0.8 to 2.0 L/min (800 to 2,000 sccm),
iv) H$_2$ gas flow rate: 1.5 to 4.5 L/min (1,500 to 4,500 sccm),
v) NH$_3$ gas flow rate: 0.5 to 2.0 L/min (500 to 2,000 sccm), and
vi) Pressure in chamber: 133 to 1,333 Pa (1 to 10 Torr).

This step is not indispensable, but is preferably performed to, e.g., prevent the Ti film from being oxidized.

After this film formation step of Step 2 is repeated for a predetermined number of wafers, the cleaning step of Step 3 is performed.

In this step, ClF$_3$ gas is supplied into the chamber 31 with no wafer present therein to perform dry cleaning. At this time, the temperature of the showerhead 40 is set to be 200 to 300° C., which is higher than the conventional temperature. Conventionally, Ti-containing deposited substances on the showerhead 40 and chamber wall are cleaned up by a relatively low temperature of about 170° C. However, it has been found that, if NiTi compounds are formed, they cannot be removed under cleaning conditions conventionally used. In light of this, studies were made of methods for effectively removing NiTi compounds, and have arrived at findings that, where the temperature of the showerhead 40 is set to be 200 to 300° C., which is higher than the conventional temperature, NiTi compounds can be decomposed and removed in accordance with the following reaction.

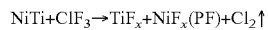
$$\text{NiTi} + \text{ClF}_3 \rightarrow \text{TiF}_x + \text{NiF}_x(\text{PF}) + \text{Cl}_2\uparrow$$

As described above, since NiTi compounds can be decomposed, an NiTi layer can be effectively removed by the cleaning of Step 3 even if the NiTi layer is formed to some extent on the showerhead 40 in the film formation of Step 2. Consequently, it is possible to further decrease problems due to the presence of NiTi compounds in subsequent pre-coating and film formation.

In this cleaning step, the temperature of the susceptor 32 heated by the heater 35 is preferably set to be 100 to 300° C. Further, the flow rate of ClF$_3$ gas is preferably set to be 100 to 2,000 mL/min (sccm). In the cleaning step, another fluorine-containing gas, such as NF$_3$ or F$_2$, may be used in place of ClF$_3$.

After this cleaning step, pre-coating is performed on the showerhead 40 and chamber inner wall, prior to the subsequent film formation, as in the pre-coating after the pre-passivation step. The pre-coating is performed under the same conditions as those for the Ti deposition step.

As described above, the showerhead temperature is set to be lower and the flow rate of $TiCl_4$ gas is set to be smaller in the film formation step of Step 2, so as to retard formation of an NiTi layer on the showerhead 40. Further, even if an NiTi layer is formed in Step 2, this layer can be remove by the cleaning step of Step 3. Consequently, it is possible to very effectively solve a problem concerning particles due to formation and growth of an NiTi layer and a problem concerning diffusion bonding between structural components. Further, the pre-passivation step is preferably performed, because it is possible to effectively retard formation of an NiTi layer even where the showerhead is a new showerhead or a showerhead processed by chemical regeneration cleaning.

Next, an explanation will be given of an experiment for confirming some effects of the present invention.

In this experiment, an apparatus for a 300-mm wafer was used.

At first, a showerhead unprocessed by the pre-passivation step and a showerhead processed by the pre-passivation step were prepared. Then, by use of these showerheads, Ti film formation was repeatedly performed on 500 wafers and then followed by cleaning under film formation conditions and cleaning conditions out of the range according to the present invention (showerhead temperature: 470° C., $TiCl_4$ flow rate: 18 mL/min (sccm), Ar flow rate: 1,600 mL/min (sccm), $H_2$ flow rate: 3,000 mL/min (sccm), $TiCl_4$ partial pressure: 2.59 Pa, and cleaning temperature: 170° C.), (samples 1 and 2). Then, the surface of the showerheads was visually observed. As a result, a black reaction product was observed on the surface of either of the showerheads. However, the sample 1 provided without the pre-passivation step showed a black reaction product all over the surface. On the other hand, the sample 2 provided with the pre-passivation step showed such a reaction product in a slightly smaller amount formed mainly at the central portion.

Figure 3:
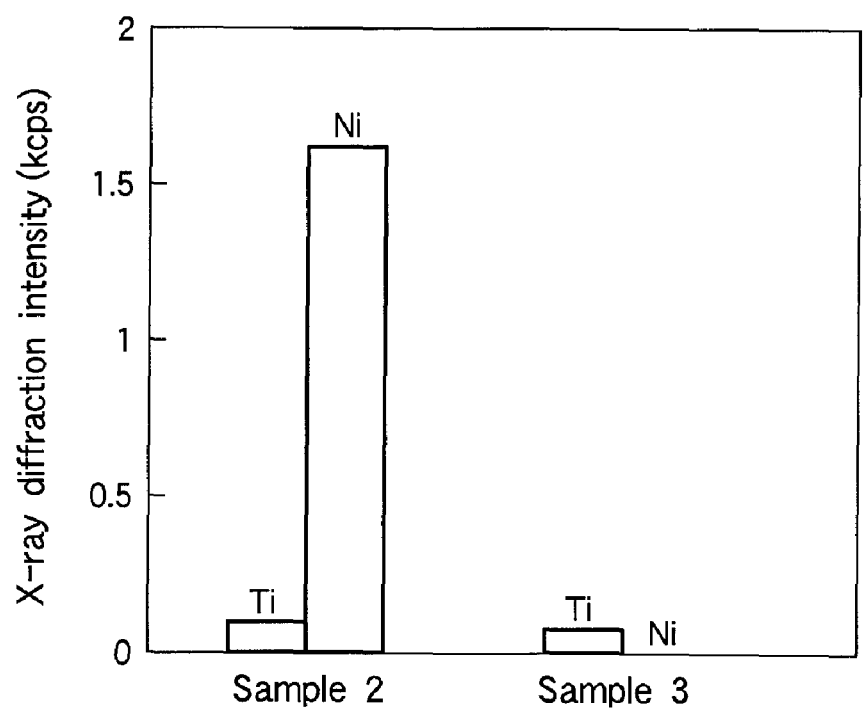
FIG. 3 This is a diagram showing Ni peak intensity and Ti peak intensity in X-ray diffraction performed on a black compound, which was peeled off from a showerhead by a tape.
Figure 4A:
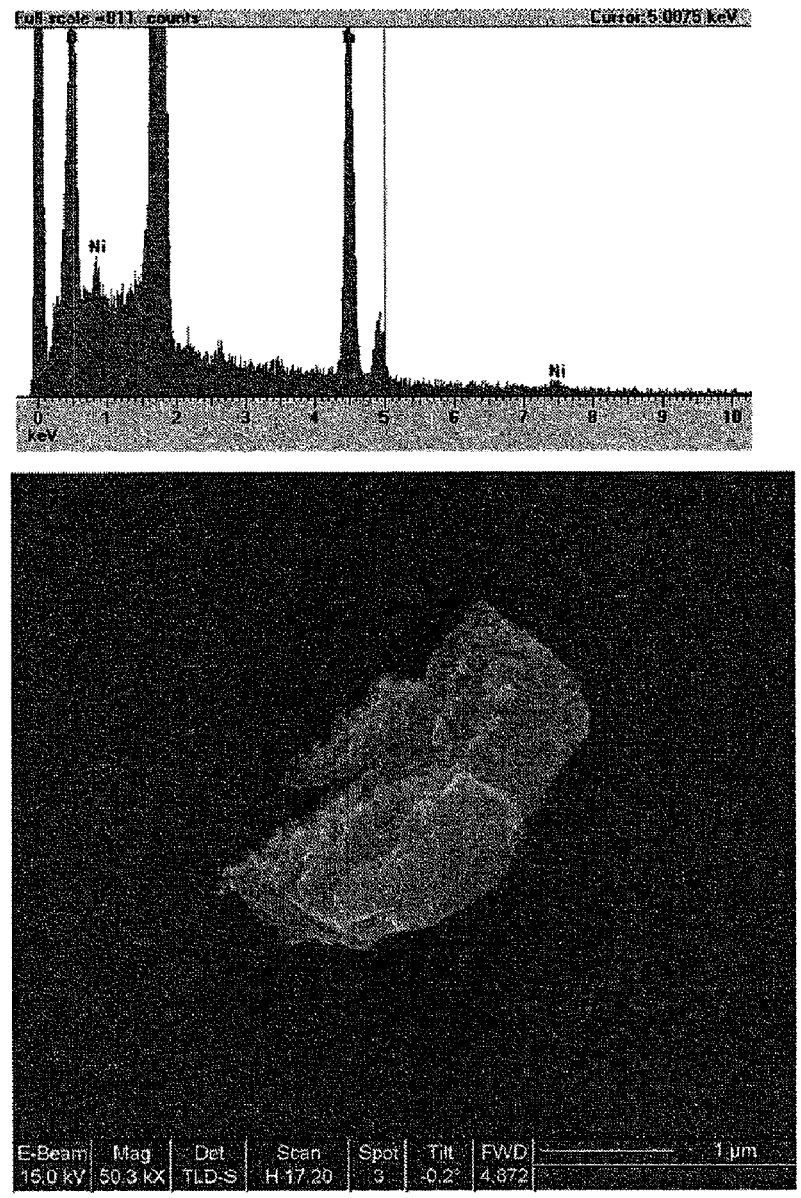
FIG. 4A This is a view showing a result of composition analysis of particles.
Figure 4B:
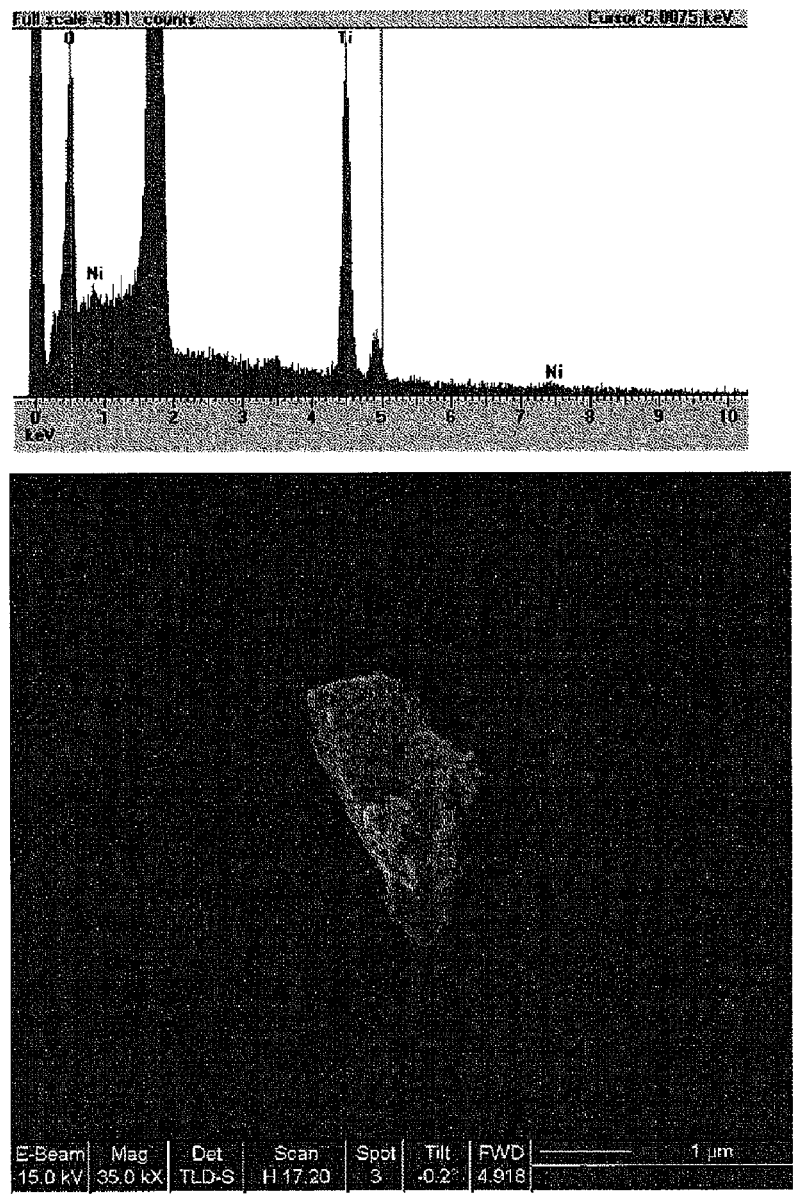
FIG. 4B This is a view showing a result of composition analysis of particles.
Figure 5:
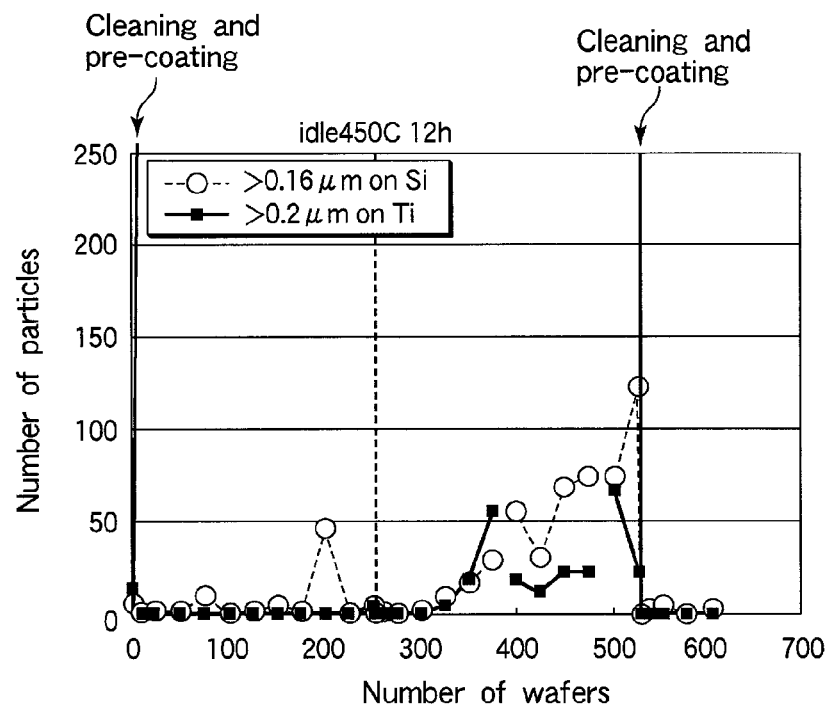
FIG. 5 This is a diagram showing a particle generation state obtained where film formation and cleaning were performed under conditions out of the range according to the present invention.
Figure 6:
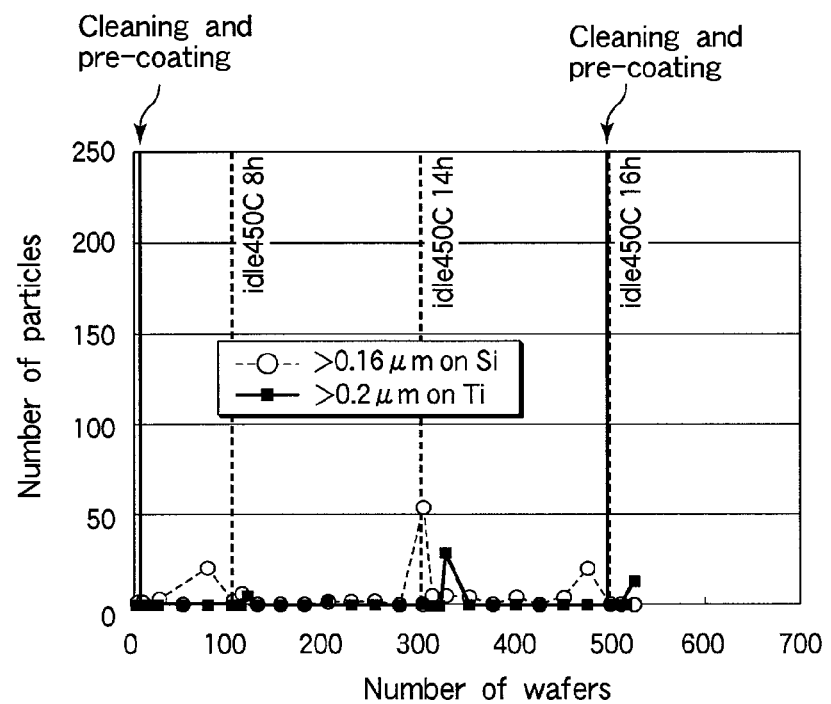
FIG. 6 This is a diagram showing a particle generation state obtained where film formation and cleaning were performed under conditions within the range according to the present invention.

Then, by use of a showerhead processed by the pre-passivation step, Ti film formation was repeatedly performed on 500 wafers and then followed by cleaning under film formation conditions and cleaning conditions within the range according to the present invention (showerhead temperature: 420° C., $TiCl_4$ flow rate: 12 mL/min (sccm), Ar flow rate: 1,600 mL/min (sccm), $H_2$ flow rate: 3,000 mL/min (sccm), $TiCl_4$ partial pressure: 1.73 Pa, and cleaning temperature: 250° C.), (sample 3). Then, a tape peeling operation was performed on the showerhead of the sample 3, as well as the showerhead of the sample 2 processed by the pre-passivation step and subsequently used for the film formation and cleaning performed under conditions out of the range according to the present invention. Then, the state of the tape thus peeled was examined by visual observation and X-ray diffraction. As a result, an attached black reaction product was observed on the tape peeled from the showerhead of the sample 2 used for the film formation and cleaning performed under conditions out of the range according to the present invention. On the other hand, no attached black reaction product was observed on the tape peeled from the showerhead of the sample 3 used under conditions within the range according to the present invention. As regards the X-ray diffraction, as shown in FIG. 3, the sample 2 used under conditions out of the range according to the present invention showed not only a Ti diffraction peak, but also an Ni diffraction peak with a higher intensity. On the other hand, the sample 3 used under conditions within the range according to the present invention showed a Ti diffraction peak, but did not show an Ni diffraction peak. From the results described above, it has been found that the black reaction product is an NiTi compound, and generation of this reaction product is essentially prevented by use of conditions within the range according to the present invention Then, examination of particle generation was made by use of a showerhead processed by the pre-passivation step in the following two cases. In one of the cases, the film formation and cleaning were performed under conventional conditions out of the range according to the present invention (showerhead temperature: 470° C., $TiCl_4$ flow rate: 18 mL/min (sccm), Ar flow rate: 1,600 mL/min (sccm), $H_2$ flow rate: 3,000 mL/min (sccm), $TiCl_4$ partial pressure: 2.59 Pa, and cleaning temperature: 170° C.). In the other of the cases, the film formation and cleaning were performed under conditions within the range according to the present invention (showerhead temperature: 420° C., $TiCl_4$ flow rate: 12 mL/min (sccm), Ar flow rate: 1,600 mL/min (sccm), $H_2$ flow rate: 3,000 mL/min (sccm), $TiCl_4$ partial pressure: 1.73 Pa, and cleaning temperature: 250° C.). In this experiment, the number of particles was counted when the film formation process was repeated about 500 times after the cleaning and pre-coating and before the subsequent cleaning and pre-coating. Further, composition analysis of particles was performed by X-ray diffraction for particles generated in the case where the film formation and cleaning were performed under conditions out of the range according to the present invention. FIGS. 4A and 4B show results of composition analysis of particles. FIGS. 5 and 6 show particle generation states obtained in the respective cases where film formation and cleaning were performed under conditions out of the range according to the present invention and under conditions within the range according to the present invention. In FIGS. 5 and 6, the plot formed of white circles represents particles of larger than 0.16 μm present on an Si wafer (also known as transfer particles), while the plot formed of black squares represents particles of larger than 2.0 μm present in a Ti film.

As shown in FIGS. 4A and 4B, particles generated in the process under conventional conditions showed Ni and Ti peaks, and thus they were supposedly derived from a reaction product generated on the showerhead and peeled off therefrom. Further, as shown in FIGS. 5 and 6, where the film formation and cleaning were performed under conditions within the range according to the present invention, particle generation was remarkably decreased, as compared to the case using conventional conditions. As shown in FIG. 6, there were several points at which the number of particles was increased. However, these particles were particles irregularly generated from a transfer system during an idling operation performed for transfer waiting, so essentially no particles were present in the film during a steady state.

As described above, some effects of the present invention were clearly confirmed.

The present invention is not limited to the embodiment described above, and it may be modified in various manners. For example, in the embodiment described above, the present invention is applied to formation of a Ti film. Alternatively, the present invention may be applied to formation of another Ti-containing film, such as a TiN film formed by use of $TiCl_4$ gas. Further, in the embodiment described above, the showerhead is made of a nickel-containing material, such as pure Ni or an Ni alloy. Alternatively, the showerhead may be provided with a nickel-containing coating layer formed thereon. The target substrate is not limited to a semiconductor wafer, and it may be another substrate, such as a substrate of a liquid crystal display device (LCD).

The invention claimed is:

1. A Ti-containing film formation method for forming a Ti-containing film on a surface of a target object placed on a susceptor inside a chamber of a film formation apparatus, while supplying a process gas containing $TiCl_4$ gas into the chamber from a showerhead that has a number of gas injection holes formed therein and facing the susceptor, the showerhead including an Ni-containing material member that defines a surface with the gas injection holes formed therein and part of inner gas passages connected to the gas injection holes, the method comprising:

preparing the film formation apparatus such that a first heater is disposed inside the susceptor and configured to be supplied with electricity from a first power supply to set a temperature of the susceptor and a second heater is disposed inside the showerhead and configured to be supplied with electricity from a second power supply other than the first power supply to set a temperature of the showerhead;

then performing formation of a Ti pre-coating film on the surface of the showerhead inside the chamber with no target object present therein;

then performing formation of a Ti-containing film on a predetermined number of target objects one by one inside the chamber, the formation of a Ti-containing film including performing formation of a Ti film;

each of the formation of the Ti pre-coating film and the formation of the Ti film being performed while heating the susceptor by the first heater, setting the showerhead at a temperature of 300 to 450° C., and supplying the process gas from the showerhead into the chamber with the $TiCl_4$ gas set at a flow rate of 1 to 12 mL/min (sccm) or the $TiCl_4$ gas set at a partial pressure of 0.1 to 2.5 Pa; and then performing cleaning inside the chamber with no target object present therein, while setting the showerhead at a temperature of 200 to 300° C. by the second heater, and supplying a fluorine-containing cleaning gas from the showerhead into the chamber.

2. The Ti-containing film formation method according to claim 1, wherein the method comprises repeating, a plurality of times, the formation of a Ti-containing film on a predetermined number of target objects and the cleaning inside the chamber.

3. The Ti-containing film formation method according to claim 1, wherein the Ti-containing film is the Ti film.

4. The Ti-containing film formation method according to claim 3, wherein the process gas contains hydrogen gas as a reducing gas.

5. The Ti-containing film formation method according to claim 3, wherein the formation of a Ti-containing film includes performing a nitriding process on the Ti film.

6. The Ti-containing film formation method according to claim 1, wherein the cleaning gas is $ClF_3$ gas.

7. The Ti-containing film formation method according to claim 1,
wherein each of the formation of a Ti pre-coating film and the formation of a Ti film includes applying an RF power into the chamber to generate plasma of the process gas, and the cleaning is performed without applying any RF power into the chamber.

8. A Ti-containing film formation method for forming a Ti-containing film on a surface of a target object placed on a susceptor inside a chamber of a film formation apparatus, while supplying a process gas containing $TiCl_4$ gas into the chamber from a showerhead that has a number of gas injection holes formed therein and facing the susceptor, the showerhead including an Ni-containing material member that defines a surface with the gas injection holes formed therein and part of inner gas passages connected to the gas injection holes, the method comprising:

preparing the film formation apparatus such that a first heater is disposed inside the susceptor and configured to be supplied with electricity from a first power supply to set a temperature of the susceptor and a second heater is disposed inside the showerhead and configured to be supplied with electricity from a second power supply other than the first power supply to set a temperature of the showerhead;

then forming a nickel fluoride passivation film on the showerhead by a reaction of the NI-containing material member with a fluorine-containing passivation gas, while supplying the passivation gas from the showerhead into the chamber with no target object present therein;

then performing formation of a Ti pre-coating film on the surface of the showerhead inside the chamber with no target object present therein;

then performing formation of a Ti-containing film on a predetermined number of target objects one by one inside the target chamber, the formation of Ti-containing film including performing formation of a Ti film;

each of the formation of the Ti pre-coating film and the formation of the Ti film being performed while heating the susceptor by the first heater, setting the showerhead at a temperature of 300 to 450° C. by the second heater, and supplying the process gas from the showerhead into the chamber with the $TiCl_4$ gas set at a flow rate of 1 to 12 mL/min (sccm) or the $TiCl_4$ gas set at a partial pressure of 0.1 to 2.5 Pa; and then performing cleaning inside the chamber with no target object present therein, while setting the showerhead at a temperature of 200 to 300° C. by the second heater, and supplying a fluorine-containing cleaning gas from the showerhead into the chamber.

9. The Ti-containing film formation method according to claim 8, wherein the passivation gas is the same as the cleaning gas.

10. The Ti-containing film formation method according to claim 8, wherein the method comprises repeating, a plurality of times, the formation of a Ti-containing film on a predetermined number of target objects and the cleaning inside the chamber.

11. The Ti-containing film formation method according to claim 8, wherein the Ti-containing film is the Ti film.

12. The Ti-containing film formation method according to claim 11, wherein the process gas contains hydrogen gas as a reducing gas.

13. The Ti-containing film formation method according to claim 11, wherein the formation of a Ti-containing film includes performing a nitriding process on the Ti film.

14. The Ti-containing film formation method according to claim 8, wherein the cleaning gas is $ClF_3$ gas.

15. The Ti-containing film formation method according to claim 8, wherein each of the formation of a Ti pre-coating film and the formation of a Ti film includes applying an RF power into the chamber to generate plasma of the process gas, and the cleaning is performed without applying any RF power into the chamber.

16. The Ti-containing film formation method according to claim 8, wherein the Ti pre-coating film is formed with the nickel fluoride passivation film present on the showerhead.

17. A Ti-containing film formation method in a film formation apparatus including a chamber with a susceptor disposed therein and serving as a lower electrode, a showerhead that has a number of gas injection holes formed therein and facing the susceptor and serves as an upper electrode, and an radio frequency (RF) power supply configured to apply an RF power across the susceptor and the showerhead, the showerhead including an Ni-containing material member that defines a surface with the gas injection holes formed therein and part of inner gas passages connected to the gas injection holes, the method forming a Ti-containing film on a surface of a target object placed on the susceptor inside the chamber, while supplying a process gas containing $TiCl_4$ gas into the chamber from the showerhead, the method comprising:

- preparing the film formation apparatus such that a first heater is disposed inside the susceptor and configured to be supplied with electricity from a first power supply to set a temperature of the susceptor and a second heater is disposed inside the showerhead and configured to be supplied with electricity from a second power supply other than the first power supply to set a temperature of the showerhead,
- then performing formation of a Ti pre-coating film on the surface of the showerhead inside the chamber with no target object present therein;
- then performing formation of a Ti-containing film on a predetermined number of target objects one by one inside the chamber, the formation of a Ti-containing film including performing formation of a Ti film;
- each of the formation of the Ti pre-coating film and the formation of the Ti film being performed while setting the susceptor at a temperature of 300 to 650° C. by the first heater, setting the showerhead at a temperature of 300 to 450° C. by the second heater, supplying the process gas from the showerhead into the chamber with the $TiCl_4$ gas set at a flow rate of 1 to 12 mL/min (sccm) or the $TiCl_4$ gas set at a partial pressure of 0.1 to 2.5 Pa, and applying an RF power from the RF power supply to generate plasma of the process gas; and
- then performing cleaning inside the chamber with no target object present therein, while setting the susceptor at a temperature of 100 to 300° C. by the first heater, setting the showerhead at a temperature of 200 to 300° C. by the second heater, and supplying a fluorine-containing cleaning gas from the showerhead into the chamber, without applying any RF power from the RF power supply.

18. The Ti-containing film formation method according to claim 17, wherein, after said preparing the film formation apparatus and before said performing formation of the Ti pre-coating film, the method further comprises forming a nickel fluoride passivation film on the showerhead by a reaction of the Ni-containing material member with a fluorine-containing passivation gas, while supplying the passivation gas from the showerhead into the chamber with no target object present therein, without applying any RF power from the RF power supply.

19. The Ti-containing film formation method according to claim 18, wherein the passivation gas is the same as the cleaning gas.

20. The Ti-containing film formation method according to claim 17, wherein the cleaning gas is $ClF_3$ gas.

\* \* \* \* \*